(12) United States Patent
Lin et al.

(10) Patent No.: US 8,766,102 B2
(45) Date of Patent: Jul. 1, 2014

(54) CHIP SUPPORT BOARD STRUCTURE

(71) Applicant: Kinsus Interconnect Technology Corp., Taoyuan (TW)

(72) Inventors: Ting-Hao Lin, Taipei (TW); Yu-Te Lu, Taoyuan Hsien (TW); De-Hao Lu, Taoyuan County (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 109 days.

(21) Appl. No.: 13/663,303

(22) Filed: Oct. 29, 2012

(65) Prior Publication Data
US 2014/0116757 A1    May 1, 2014

(51) Int. Cl.
*H05K 1/03* (2006.01)
*H05K 7/02* (2006.01)

(52) U.S. Cl.
USPC ............ 174/255; 174/257; 174/260; 361/807

(58) Field of Classification Search
USPC ........... 174/255–257, 260, 261; 361/807–809
See application file for complete search history.

(56) References Cited

U.S. PATENT DOCUMENTS

| | | | | |
|---|---|---|---|---|
| 5,379,187 A | * | 1/1995 | Lee et al. | 361/707 |
| 5,719,442 A | * | 2/1998 | Otsuki | 257/712 |
| 5,883,567 A | * | 3/1999 | Mullins, Jr. | 338/32 H |
| 6,677,662 B1 | * | 1/2004 | Chung et al. | 257/666 |
| 6,781,219 B2 | * | 8/2004 | Bissey | 257/666 |
| 7,033,866 B2 | * | 4/2006 | Chow et al. | 438/123 |
| 8,133,759 B2 | * | 3/2012 | Lee et al. | 438/106 |
| 2005/0121756 A1 | * | 6/2005 | Chow et al. | 257/676 |
| 2005/0156291 A1 | * | 7/2005 | Shiu et al. | 257/666 |

* cited by examiner

*Primary Examiner* — Hoa C Nguyen
(74) *Attorney, Agent, or Firm* — Lin & Associates IP, Inc.

(57) ABSTRACT

A chip support board structure which includes at least a metal substrate, a block layer, a paddle, an insulation layer, a circuit layer and a solder resist is disclosed. The circuit layer connects with the paddle. The material of the block layer is different from that of the metal substrate and the block layer is provided between the metal substrate and the paddle such that the shape and the depth of the paddle is maintained constant and the problem of different depth and easily peeling off is avoided, thereby improving the yield rate of the chip support board.

8 Claims, 3 Drawing Sheets

CHIP SUPPORT BOARD STRUCTURE

BACKGROUND OF THE INVENTION

1. Field of the Invention

The present invention generally relates to a chip support board structure, and more specifically to a chip support board structure having a block layer on a metal substrate to maintain a paddle with high stability and further avoid the problem of easily peeling off.

2. The Prior Arts

Please refer to FIGS. 1A and 1B for illustrating the first and second examples of the chip support board in the prior arts, respectively. The chip support board 100 shown in FIG. 1A generally comprises a metal substrate 10, a paddle 15 on the metal substrate 10, an insulation layer 30, a circuit layer 40 and a solder resist 60. The insulation layer 30 fills up the space between the paddle 15 and the metal substrate 10, but one surface of the paddle 15 is exposed from the insulation layer 30 such that the surface of the paddle 15 and the insulation layer 30 form a co-plane surface. The circuit layer 40 is formed on the co-plane surface and is connected with the paddle 15. The solder resist 60 is formed on the insulation layer 30 and the circuit layer 40 to cover part of the circuit layer 40 so as to avoid short circuit upon forming the bonding pads (not shown).

As shown in FIG. 1B, the chip support board 150 in the prior arts is varied with respect to the above chip support board 100 by a carbon fiber prepreg cloth 50 embedded in the insulation layer 30 and a conductive layer 55 formed on the carbon fiber prepreg cloth 50. The circuit layer 40 is formed on the co-plane surface which is formed by the paddle 15, the insulation layer 30 and the conductive layer 55 so as to connect with the paddle 15 and the conductive layer 55.

However, one of the shortcomings of the chip support board in the prior arts is that the paddle 15 is generally formed by the etching process on the circuit layer 40, that is, directly formed of the circuit layer 40. It is difficult to maintain the shape, the etching depth and the void depth of the paddle 15 in the mass production because of the same material. This leads to failure of maintaining a smooth surface, and therefore, it is hard to maintain constant the location of the carbon fiber prepreg cloth 50 and the conductive layer 55 formed on the carbon fiber prepreg cloth 50. Additionally, the board is easily peeled off due to external force, thereby affecting the yield rate of the board.

SUMMARY OF THE INVENTION

A primary objective of the present invention is to provide a chip support board structure, which comprises: a metal substrate; a block layer provided on the metal substrate and covering at least part of an upper surface of the metal substrate; a paddle formed on the block layer; an insulation layer filling up a space between the paddle and the block layer; a circuit layer formed on the insulation layer and the paddle, and connecting with the paddle; and a solder resist formed on the insulation layer and the circuit layer to cover part of the circuit layer, wherein a surface of the paddle is exposed from the insulation layer, and the circuit layer is formed on part of a co-plane surface which formed by the surface of the paddle and the insulation layer.

Another objective of the present invention is to provide a chip support board structure, which comprises: a metal substrate; a block layer provided on the metal substrate and covering at least part of an upper surface of the metal substrate; a paddle formed on the block layer; an insulation layer filling up a space between the paddle and the block layer; at least one carbon fiber prepreg cloth; at least one conductive layer formed on the at least one carbon fiber prepreg cloth, each conductive layer is paired with a corresponding carbon fiber prepreg cloth, the at least one conductive layer and a surface of the paddle are exposed from the insulation layer such that the at least one conductive layer, the surface of the paddle and the insulation layer form a co-plane surface; a circuit layer formed on part of the co-plane surface and connected with the paddle and the at least one conductive layer; and a solder resist formed on the insulation layer and the conductive layer which are not covered by the circuit layer, and meanwhile covering part of the circuit layer.

The block layer may completely cover the upper surface of the metal substrate, or is just provided beneath the bottom of the paddle. The block layer is provided between the metal substrate and the paddle such that the shape and the depth of the paddle is maintained constant and the problem of different depth and easily peeling off is avoided, thereby improving the yield rate of the chip support board.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1A:
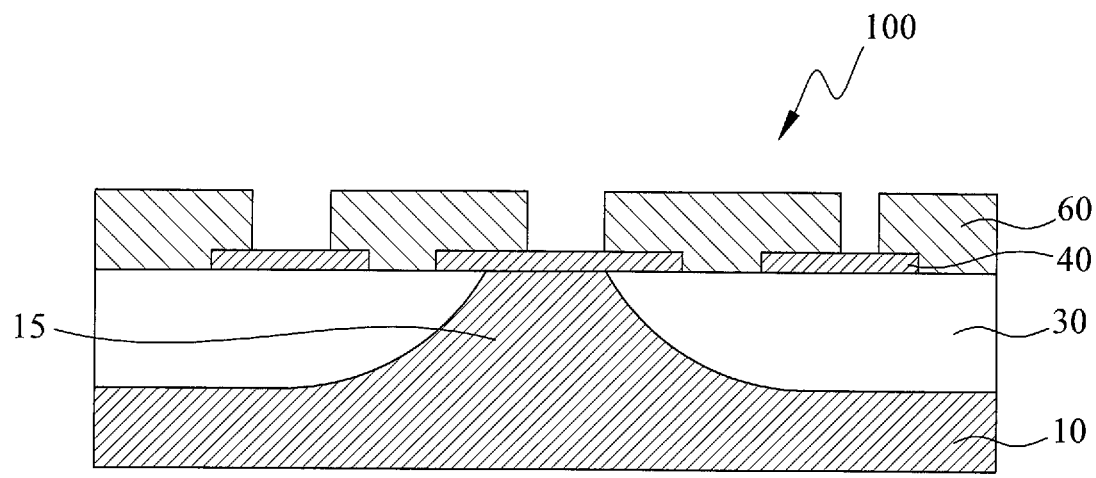
FIG. 1A schematically shows a diagram to illustrate a first example of the chip support board in the prior arts.
Figure 1B:
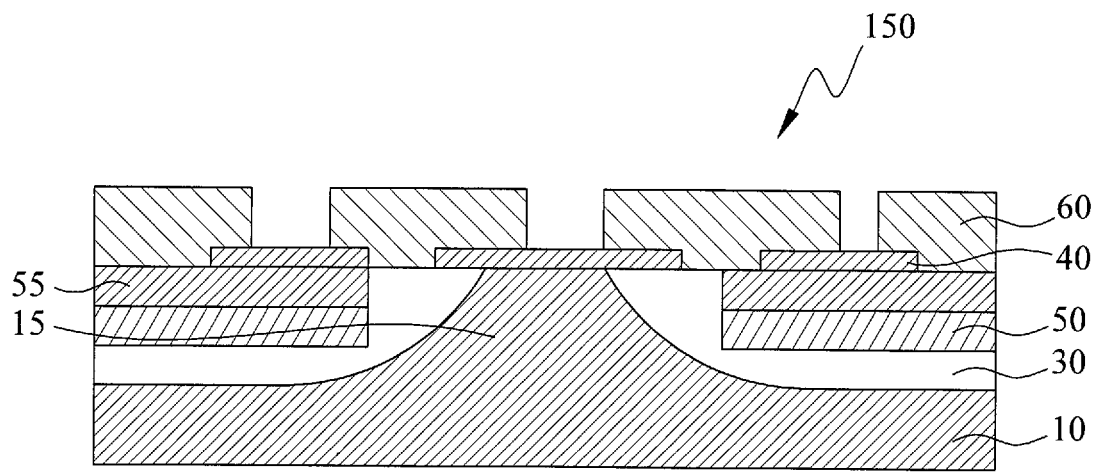
FIG. 1B shows a diagram to illustrate a second example of the chip support board in the prior arts.
Figure 2A:
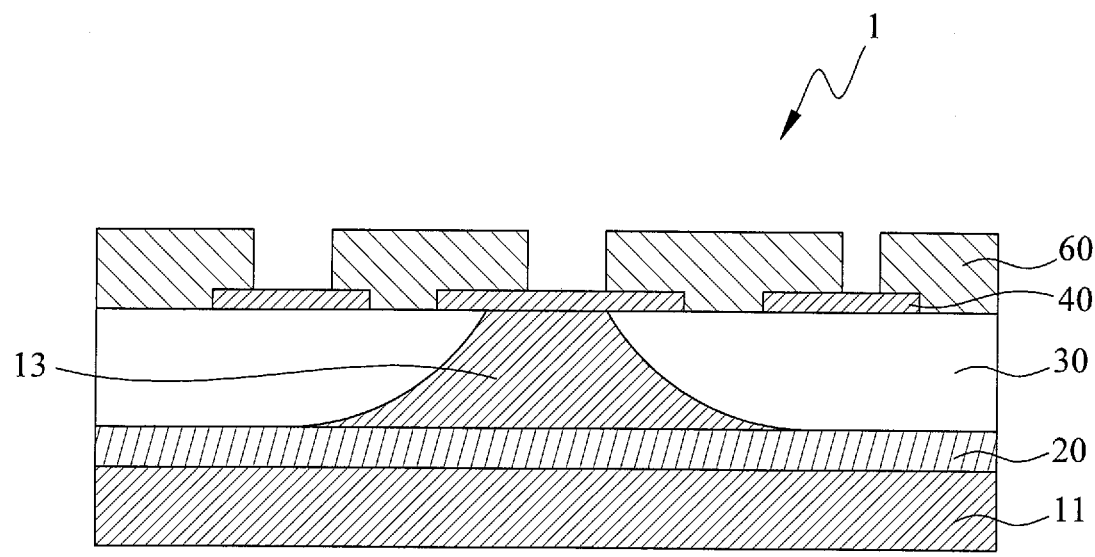
FIG. 2A shows a schematic diagram of the chip support board structure according to the first embodiment of the present invention.
Figure 2B:
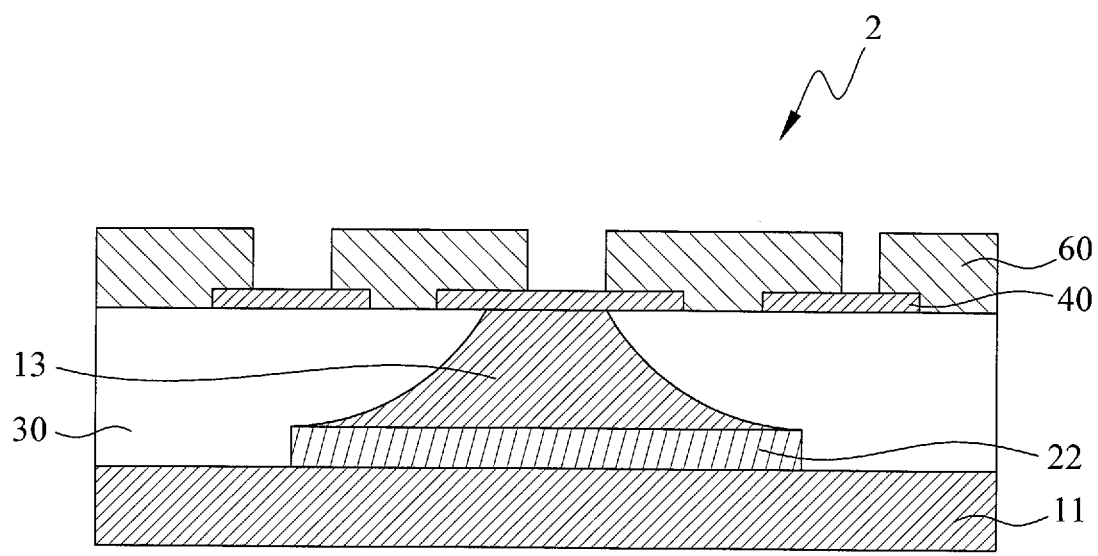
FIG. 2B shows a schematic diagram of the chip support board structure according to the second embodiment of the present invention.

Please refer to FIGS. 2A and 2B for illustrating the chip support board structures according to the first and second embodiments of the present invention, respectively. As shown in FIG. 2A, the chip support board structure 1 according to the first embodiment of the present invention comprises a metal substrate 11, a block layer 20, a paddle 13, an insulation layer 30, a circuit layer 40 and a solder resist 60. The block layer 20 is provided on the metal substrate 11, and covers the upper surface of the metal substrate 11. The paddle 13 is formed on the block layer 20. The insulation layer 30 fills up the space between the paddle 13 and the block layer 20. One surface of the paddle 13 is exposed from the insulation layer 30, and the surface of the paddle 13 and the insulation layer 30 form a co-plane surface. The circuit layer 40 is formed on part of the co-plane surface and connected with the paddle 13. The solder resist 60 is formed on the insulation layer 30 and the circuit layer 40 to cover the insulation layer 30 not covered by the circuit layer 40 and part of the circuit layer 40 so as to avoid short circuit upon forming the bonding pads (not shown).

As shown in FIG. 2B, the chip support board structure 2 of the second embodiment of the present invention is basically similar to the first embodiment as shown in FIG. 2A, and the difference is that the block layer 22 in the second embodiment is formed between the metal substrate 11 and the paddle 13, and particularly, only formed beneath the bottom of the paddle 13 and not completely covered by the metal substrate 11. The insulation layer 30 fills up the space among the paddle 13, the block layer 20 and the metal substrate 11.

Figure 3A:
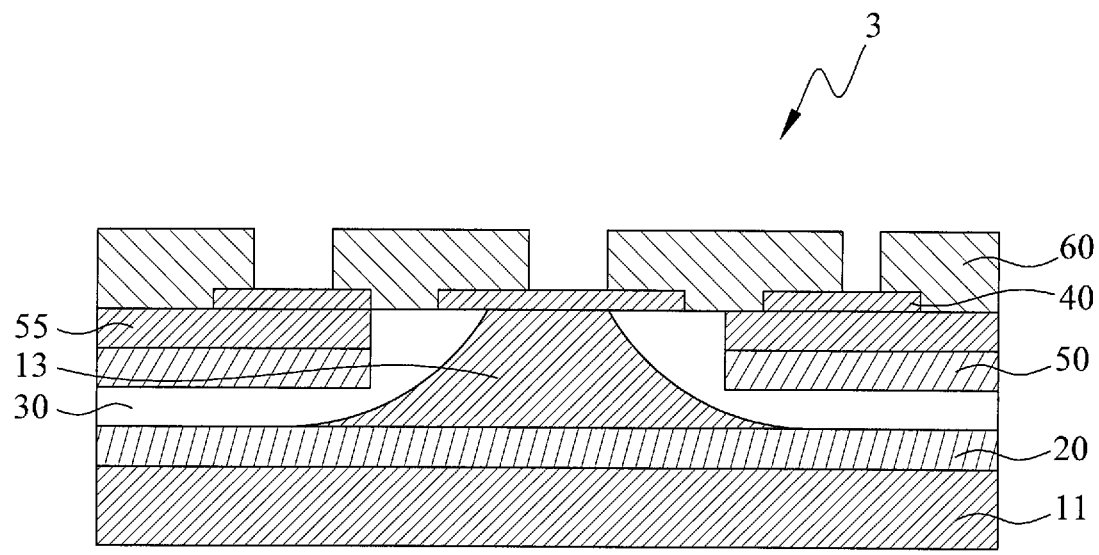
FIG. 3A shows a schematic diagram of the chip support board structure according to the third embodiment of the present invention.
Figure 3B:
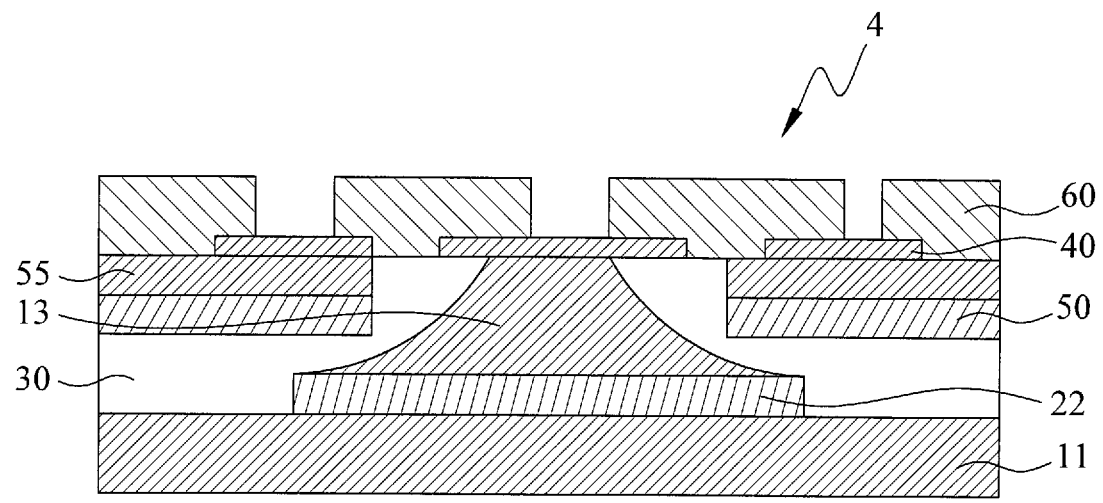
FIG. 3B shows a schematic diagram of the chip support board structure according to the fourth embodiment of the present invention.

Please refer to FIGS. 3A and 3B for illustrating the chip support board structures according to the third and fourth embodiments of the present invention, respectively. As shown in FIG. 3A, the chip support board structure 3 according to the third embodiment comprises a metal substrate 11, a block layer 20, a paddle 13, an insulation layer 30, a circuit layer 40, at least one carbon fiber prepreg cloth 50, least one conductive layer 55 and a solder resist 60. The block layer 20 is provided on the metal substrate 11 and covers the upper surface of the metal substrate 11. The paddle 13 is formed on the block layer 20. The insulation layer 30 fills up the space between the paddle 13 and the block layer 20. The carbon fiber prepreg cloth 50 and the conductive layer 55 on the carbon fiber prepreg cloth 50 are provided in the insulation layer 30. The conductive layer 55 and one surface of the paddle 13 are exposed from the insulation layer 30 such that the conductive layer 55, the surface of the paddle 13 and the insulation layer 30 form a co-plane surface.

The circuit layer 40 is formed on part of the co-plane surface and connected with the paddle 13 and the conductive layer 55. The solder resist 60 is formed on the insulation layer 30, the circuit layer 40 and the conductive layer 55 so as to cover the conductive layer 55 and the insulation layer 30 which are not covered by the circuit layer 40. Meanwhile the solder resist 60 covers part of the circuit layer 40 to avoid short circuit upon forming the bonding pads (not shown).

As shown in FIG. 3B, the chip support board structure 3 of the fourth embodiment of the present invention is basically similar to the third embodiment as shown in FIG. 3A, and one of the primary differences is that the block layer 22 in this embodiment is formed between the metal substrate 11 and the paddle 13, and particularly, only formed beneath the bottom of the paddle 13 and not completely covered by the metal substrate 11. The insulation layer 30 fills up the space among the paddle 13, the block layer 20 and the metal substrate 11.

The metal substrate 11, the paddle 13 and the circuit layer 40 are made of at least one of copper and aluminum. The block layer 20, 22 is made of at least one of tin, nickel, titanium and palladium which further forms an intermetallic compound with the material forming the metal substrate 11. The block layer 20, 22 has a thickness between 3~10 μm, and the insulation layer 30 is made of one of a BT resin, a glass fiber, an ABF (Ajinomoto Build-Up Film) film.

One aspect of the present invention is that the block layer 20 is provided between the metal substrate 11 and the paddle 13 such that the shape and the depth of the paddle 13 is maintained constant and the problem of different depth and easily peeling off is avoided, thereby improving the yield rate of the chip support board.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A chip support board structure, comprising:
   a metal substrate;
   a block layer provided on the metal substrate and covering at least part of an upper surface of the metal substrate;
   a paddle formed on the block layer;
   an insulation layer filling up a space between the paddle and the block layer;
   a circuit layer formed on the insulation layer and the paddle, and connecting with the paddle; and
   a solder resist formed on the insulation layer and the circuit layer to cover part of the circuit layer,
   wherein the block layer is formed of a material different from that of the metal substrate and the paddle, a surface of the paddle is exposed from the insulation layer, and the circuit layer is formed on part of a co-plane surface which formed by the surface of the paddle and the insulation layer.

2. The chip support board structure as claimed in claim 1, wherein the block layer is configured to completely cover the upper surface of the metal substrate.

3. The chip support board structure as claimed in claim 1, wherein the block layer covering the part of the upper surface of the metal substrate is provided beneath a bottom of the paddle such that the insulation layer further fills up a space among the paddle, the block layer and the metal substrate.

4. The chip support board structure as claimed in claim 1, wherein the metal substrate, the paddle and the circuit layer are made of at least one of copper and aluminum, the block layer is made of at least one of tin, nickel, titanium and palladium which further forms an intermetallic compound with a material forming the metal substrate, the block layer has a thickness between 3~10 μm, and the insulation layer is made of one of a BT resin, a glass fiber, an ABF (Ajinomoto Build-Up Film) film.

5. A chip support board structure, comprising:
   a metal substrate;
   a block layer provided on the metal substrate and covering at least part of an upper surface of the metal substrate;
   a paddle formed on the block layer;
   an insulation layer filling up a space between the paddle and the block layer;
   at least one carbon fiber prepreg cloth;
   at least one conductive layer formed on the at least one carbon fiber prepreg cloth, each conductive layer is paired with a corresponding carbon fiber prepreg cloth, the at least one conductive layer and a surface of the paddle are exposed from the insulation layer such that the at least one conductive layer, the surface of the paddle and the insulation layer form a co-plane surface;
   a circuit layer formed on part of the co-plane surface and connected with the paddle and the at least one conductive layer; and
   a solder resist formed on the insulation layer and the conductive layer which are not covered by the circuit layer, and covering part of the circuit layer,
   wherein the block layer is formed of a material different from that of the metal substrate and the paddle.

6. The chip support board structure as claimed in claim 5, wherein the block layer is configured to completely cover the upper surface of the metal substrate.

7. The chip support board structure as claimed in claim 5, wherein the block layer covering the part of the upper surface of the metal substrate is provided beneath a bottom of the paddle such that the insulation layer further fills up a space among the paddle, the block layer and the metal substrate.

8. The chip support board structure as claimed in claim 5, wherein the metal substrate, the paddle, the at least one conductive layer and the circuit layer are made of at least one of copper and aluminum, the block layer is made of at least one of tin, nickel, titanium and palladium which further forms an intermetallic compound with a material forming the metal substrate, the block layer has a thickness between 3~10 μm, and the insulation layer is made of one of a BT resin, a glass fiber, an ABF film.

* * * * *